(12) United States Patent
Tuttle

(10) Patent No.: US 12,052,837 B2
(45) Date of Patent: Jul. 30, 2024

(54) PIN-LESS CAPTIVE HINGE ASSEMBLY FOR COMPACT COMBINATION ELECTRICAL PANEL SAFETY MONITOR AND TEST POINT

(71) Applicant: Grace Technologies, Inc., Davenport, IA (US)

(72) Inventor: Aaron E. Tuttle, McCausland, IA (US)

(73) Assignee: GRACE TECHNOLOGIES, INC., Davenport, IA (US)

( * ) Notice: Subject to any disclaimer, the term of this patent is extended or adjusted under 35 U.S.C. 154(b) by 59 days.

(21) Appl. No.: 17/752,742

(22) Filed: May 24, 2022

(65) Prior Publication Data

US 2023/0389204 A1    Nov. 30, 2023

(51) Int. Cl.
| | |
|---|---|
| H05K 5/02 | (2006.01) |
| E05D 1/06 | (2006.01) |
| E05D 7/10 | (2006.01) |
| H05K 5/03 | (2006.01) |

(52) U.S. Cl.
CPC ............ *H05K 5/0226* (2013.01); *E05D 1/06* (2013.01); *E05D 7/1066* (2013.01); *H05K 5/03* (2013.01); *E05Y 2900/60* (2013.01)

(58) Field of Classification Search
CPC ............................... H05K 5/0226; H05K 5/03
USPC ......................................................... 361/756
See application file for complete search history.

(56) References Cited

U.S. PATENT DOCUMENTS

| | | | | |
|---|---|---|---|---|
| 5,045,640 | A | * | 9/1991 | Riceman ............... H01R 13/447 174/67 |
| 5,524,864 | A | * | 6/1996 | Dubach .................. B67D 3/043 251/274 |
| 6,703,938 | B1 | | 3/2004 | Clarke |
| 9,013,296 | B2 | | 4/2015 | Clarke |
| 2016/0072266 | A1 | * | 3/2016 | Bulancea ................. H02G 3/14 174/67 |
| 2017/0143184 | A1 | * | 5/2017 | Wegener ............... D06F 39/026 |
| 2021/0118629 | A1 | * | 4/2021 | Burkett ................... B60L 50/60 |
| 2022/0120791 | A1 | * | 4/2022 | Adkins ............... H01R 13/746 |
| 2022/0148392 | A1 | | 5/2022 | Adkins et al. |

OTHER PUBLICATIONS

Adkins et al., U.S. Appl. No. 17/529,579, filed Nov. 18, 2021, Wireless Voltage Measurement, Testing and Analytics System.
Breitsprecher et al., U.S. Appl. No. 29/780,030, filed Apr. 22, 2021, Voltage Indicator With Test Points.
Van Itallie et al., U.S. Appl. No. 17/551,993, filed Dec. 15, 2021, Compact Combination Electrical Panel Safety Monitor and Test Point.

* cited by examiner

*Primary Examiner* — Hung S. Bui
(74) *Attorney, Agent, or Firm* — Goodhue, Coleman & Owens, P.C.

(57) ABSTRACT

An assembly includes a cover receiving frame having a first hinge portion thereon, the first hinge portion having a generally c-shape and a plurality of alternating supports positioned along a bottom portion of the first hinge portion. The assembly further includes a cover having a second hinge portion thereon for interconnection with the first hinge portion. The second hinge portion includes an elongated member for fitting generally within the c-shape and a plurality of alternating cutouts positioned along the elongated member. The assembly is assembled by positioning the cover parallel to the cover receiving frame and rotating the cover until it is captive.

20 Claims, 9 Drawing Sheets

PIN-LESS CAPTIVE HINGE ASSEMBLY FOR COMPACT COMBINATION ELECTRICAL PANEL SAFETY MONITOR AND TEST POINT

FIELD OF THE INVENTION

The present invention relates to a pin-less captive hinge assembly. More particularly, but not exclusively, the present invention relates to a pin-less captive hinge assembly suitable for use in products such as a compact combination electrical panel safety monitor and test point.

BACKGROUND

Although the pin-less hinge assembly disclosed herein can be used in a variety of different applications and environments, the background of the art is discussed with respect to use in an electrical safety device. However, it is to be understood that the pin-less captive hinge assembly aspect of the present invention is not to be limited by this discussion.

Thus, in one aspect, the present invention relates to electrical safety, and more particularly to monitoring of circuits such as 1000 VAC or 1500 VDC voltages using voltage indicators. A voltage indicator is generally a low cost device that pre-verifies electrical isolation before maintenance personnel open a control panel and risk exposure to hazardous voltages. Typically mounted to the panel exterior and hardwired into the load side of the main disconnect, this device provides electrical maintenance with an additional safety value. Easy to apply, low cost, quick installation, and inherent reliability makes a voltage indicator a very effective electrical safety device.

Creating and insuring an electrically safe work condition is critical for electricians performing maintenance on de-energized systems. The presence of voltage is the only determining factor if an electrical accident or an arc flash can possibly occur—No voltage, No accident, No arc flash. "Voltage or no voltage" is also the basis of the NFPA 70E's (National Fire Protection Association Standard's for Electrical Safety Requirements for Employee Workplaces) two primary themes: a) establishing an electrically safe work condition, and b) achieving safety while working on energized systems. A voltage warning indicator is like a 'hard wired voltmeter' with the advantage that it needs no power supply or batteries because it is powered from the same 'voltage' that it indicates. A voltage indicator is an additional safety measure between maintenance personnel and hazardous voltage.

Commonly owned, U.S. patent application Ser. No. 17/551,993, entitled, "Compact Combination Electrical Panel Safety Monitor and Test Point", hereby incorporated by reference in its entirety, describes one example of an electrical safety monitor which has a cover. The electrical safety device described provides a voltage warning indicator with the ability to conduct a full absence of voltage test required as part of a lock-out/tag-out process without exposing the electrician to unsafe risk of electrical shock or arc flash. Despite the significant advantages of such a device, problems remain.

In particular, it would be advantageous to include a cover with a hinge assembly on such a device that is not cumbersome to assemble, and which is efficient and cost-effective to manufacture. What is needed is an improved hinge assembly and an electrical safety device which includes such an improved hinge assembly.

SUMMARY

Therefore, it is a primary object, feature, or advantage of the present invention to improve over the state of the art.

Another object, feature, or advantage of the present invention is to provide a hinge which is not cumbersome to assemble.

Yet another object, feature, or advantage of the present invention is to provide a hinge assembly which does not use a pin.

Another object, feature, or advantage of the present invention is to provide a hinge assembly which may be made out of plastic.

Yet another object, feature, or advantage of the present invention is to provide a hinge assembly which may be clear, such as if made out of a clear plastic.

It is a further object, feature, or advantage of the present invention to provide for a part which may be manufactured and assembled in an efficient manner.

It is a still further object, feature, or advantage of the present invention to provide for a part which may be formed by injection molding without requiring slides.

It is a further object, feature, or advantage of the present invention to provide a hinge assembly suitable for use with an electrical panel safety monitor which includes test points.

Another object, feature, or advantage is to provide a clear, yet waterproof, cover which may be lockable and provides environmental ratings as appropriate for use in most industrial applications (UL Type 4, 4X, 12, 13) and which is hinged to the housing of the electrical safety device.

Yet another object, feature, or advantage is to provide a hinge assembly for a cover to a housing with a face on which both test points and illuminated areas indicative of presence of voltage may be positioned.

One or more of these and/or other objects, features, or advantages of the present invention will become apparent from the specification and claims that follow. No single embodiment need provide each and every object, feature, or advantage. Different embodiments may have different objects, features, or advantages. Therefore, the present invention is not to be limited to or by any objects, features, or advantages stated herein.

According to one aspect, an assembly is provided. The assembly includes a cover receiving frame having a first hinge portion thereon, the first hinge portion having a generally c-shape and a plurality of alternating supports positioned along a bottom portion of the first hinge portion. The assembly further includes a cover having a second hinge portion thereon for interconnection with the first hinge portion. The second hinge portion includes an elongated member for fitting generally within the c-shape and a plurality of alternating cutouts positioned along the elongated member. The assembly is assembled by positioning the cover parallel to the cover receiving frame and rotating the cover until it is captive. The cover receiving frame and cover may be formed of plastic. The cover may be molded without slides and may be formed from transparent plastic. The assembly may further include a housing with a face with one or more visual indicators and positioned such that the face is exposed when the cover is in a hinged open position. The voltage indicator may further include a plurality of test points, each of the plurality of test points accessible at the face of the housing when the cover is in the hinged open position. There may further be illumination areas associated with each of the test points, wherein each of the illumination areas is provided light by one or more of the plurality of light indicators and each of the illumination areas is positioned around a corresponding one of the test points. The test points may be conduct wells for insertion of a test probe.

According to another aspect, an assembly includes a cover receiving frame having a first hinge portion thereon, the first hinge portion having a generally c-shape and a plurality of alternating supports positioned along a bottom portion of the first hinge portion. The assembly further includes a cover formed from transparent plastic having a second hinge portion thereon for interconnection with the first hinge portion. The second hinge portion includes an elongated member for fitting generally within the c-shape and a plurality of alternating cutouts positioned along the elongated member. The assembly may be assembled by positioning the cover parallel to the cover receiving frame and rotating the cover until it is captive. Thus, the first hinge portion and the second hinge portion form a pin-less captive hinge assembly.

According to another aspect, an electrical safety device includes a housing with a face with one or more visual indicators positioned on the face, a cover receiving frame for placement on an end of the housing, the cover receiving frame having a first hinge portion thereon, the first hinge portion having a generally c-shape and a plurality of alternating supports positioned along a bottom portion of the first hinge portion. The electrical safety device further includes a cover formed from transparent plastic having a second hinge portion thereon for interconnection with the first hinge portion. The second hinge portion has an elongated member for fitting generally within the c-shape and a plurality of alternating cutouts positioned along the elongated member. The cover receiving frame is assembled with the cover by positioning the cover parallel to the cover receiving frame and rotating the cover until it is captive. The first hinge portion and the second hinge portion form a pin-less hinge.

BRIEF DESCRIPTION OF THE DRAWINGS

Illustrated embodiments of the disclosure are described in detail below with reference to the attached drawing figures, which are incorporated by reference herein.

DETAILED DESCRIPTION

Figure 1:
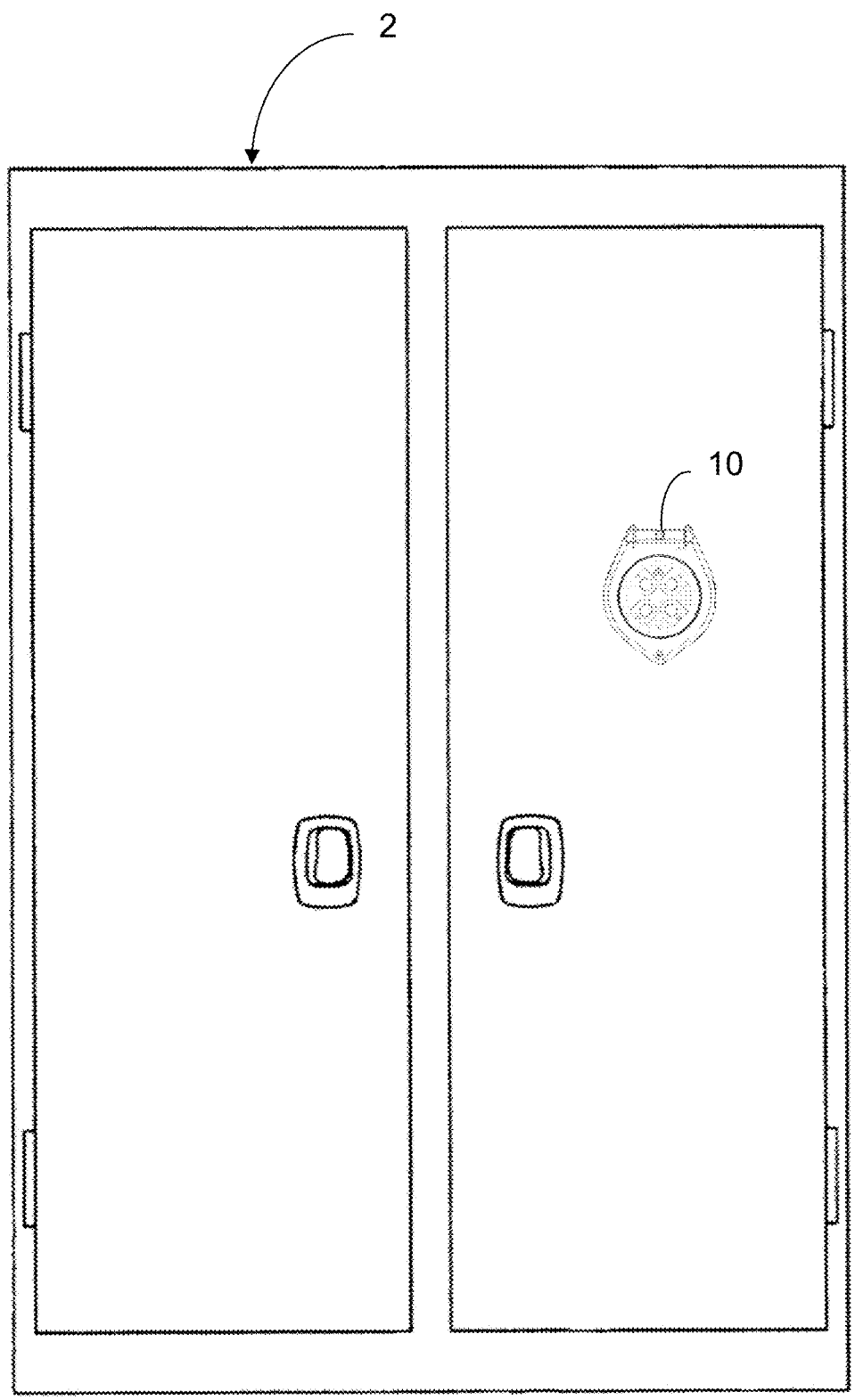
FIG. 1 is a view of a cabinet or enclosure to which an electrical safety monitor with test points is mounted.

FIG. 1 is a view of one embodiment of the present invention. A control cabinet 2 is shown. A device 10 is shown which is mounted to the control panel cabinet 12. The device 10 may be a permanent electrical safety device (PESD) that allows qualified individuals to perform an absence of voltage test (AVT) from outside of the electrical cabinet. The device 10 may be mounted directly on any enclosure with the option to test either the line side or the load side. The device 10 includes an assembly which includes a cover receiving frame with a cover.

Figure 2:
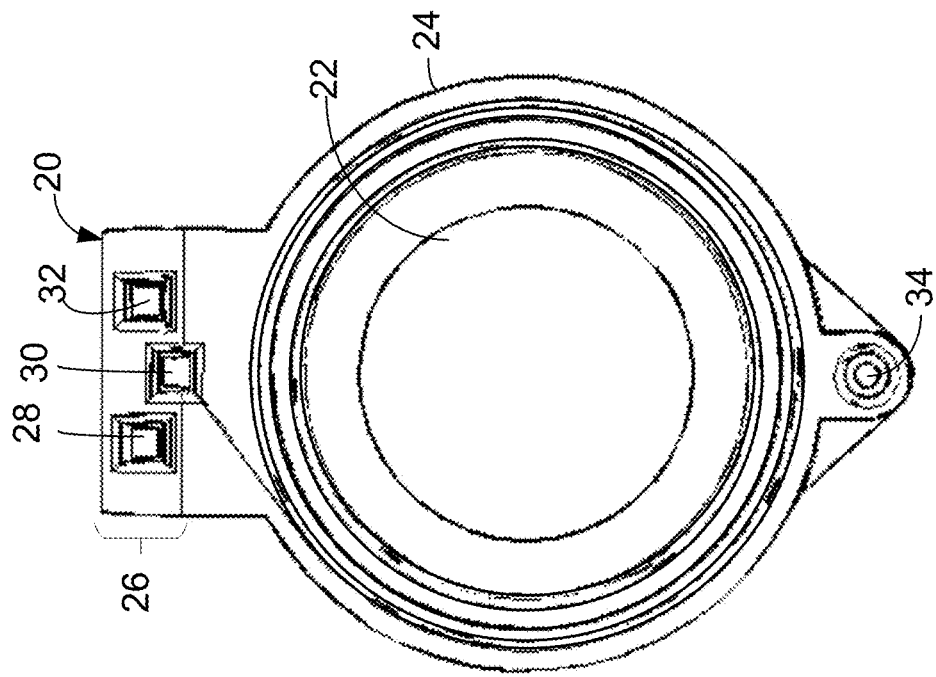
FIG. 2 is a top view of the cap.

FIG. 2 is a top view of the cover receiving frame 20 in more detail. The cover receiving frame 20 has a main body 24. A generally circular opening 22 is shown. The cover receiving frame 20 may be placed through a housing of an electrical safety device such as a PESD. An opening 34 is shown for accepting a fastener. A first hinge portion 26 is shown. The first hinge portion 26 of the cover receiving frame connects with a second hinge portion of a cover receiving frame in order to form a pin-less captive hinge assembly.

Figure 3:
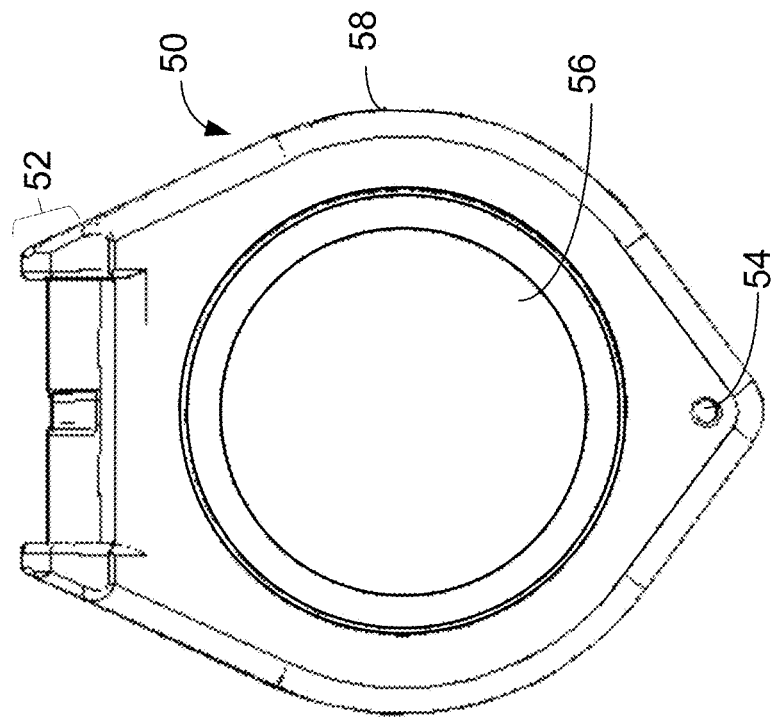
FIG. 3 is a top view of the cover.

FIG. 3 is a top view of the cover 50. The cover 50 has a main body 58. A central portion 56 is generally circular. An opening 54 is shown for accepting a fastener. A second hinge portion 52 is shown at the top of the cover. Both the cover receiving frame and the cover may be formed of plastic. Where the cover is formed from a transparent or clear plastic, a face of a PESD may be viewed even when the cover is in a fully closed position.

Figure 4:
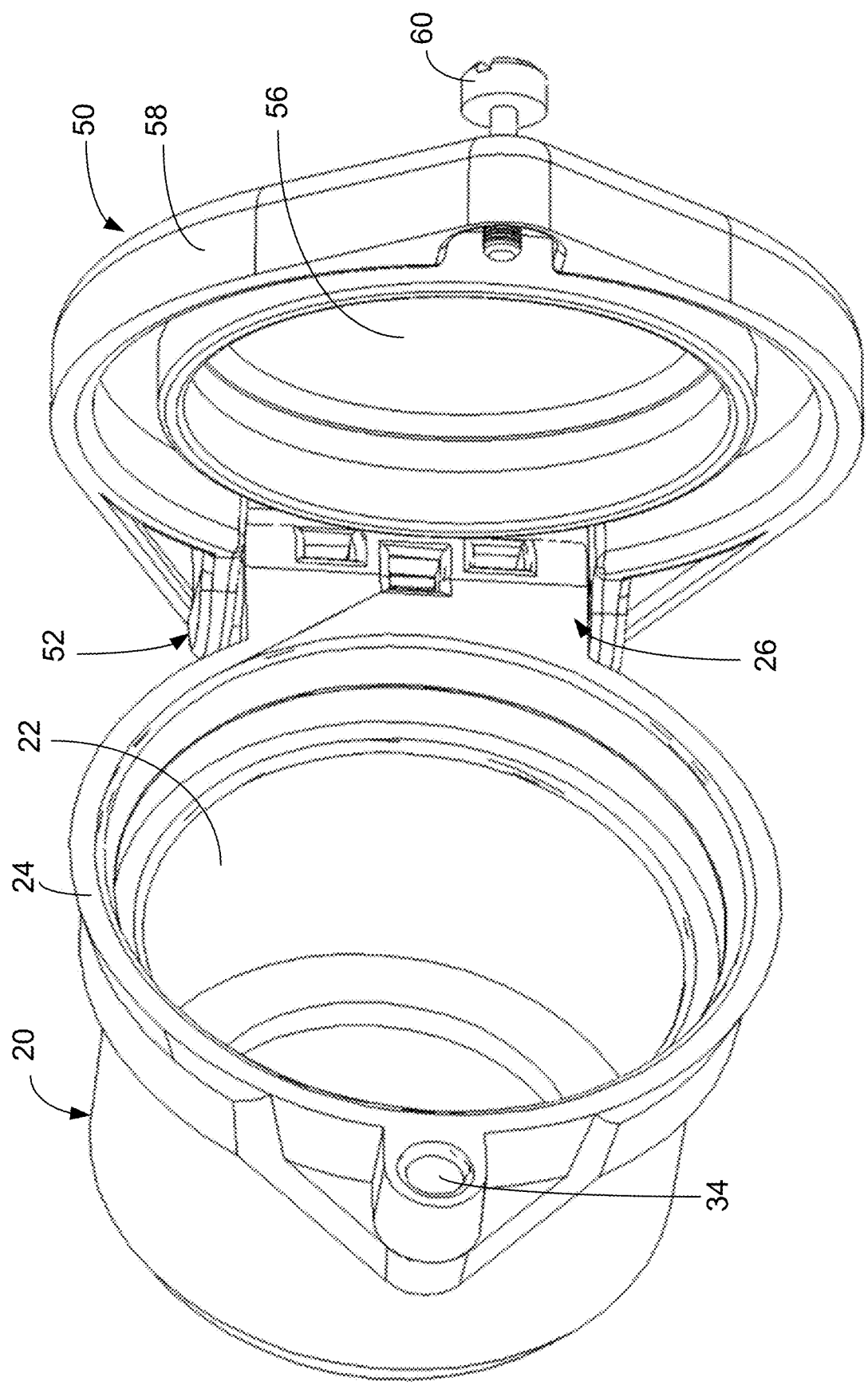
FIG. 4 is a perspective view of an assembly including both the cover receiving frame and the cover.

FIG. 4 is a perspective view of an assembly including both the cover receiving frame 20 and the cover 50. As shown in FIG. 4, the first hinge portion 26 and the second hinge portion 52 are assembled into a hinge. Also shown in FIG. 4 is a screw 60 which is used to secure the cover 50 to the cover receiving frame 20 when the cover is in a fully closed position.

Figure 5:
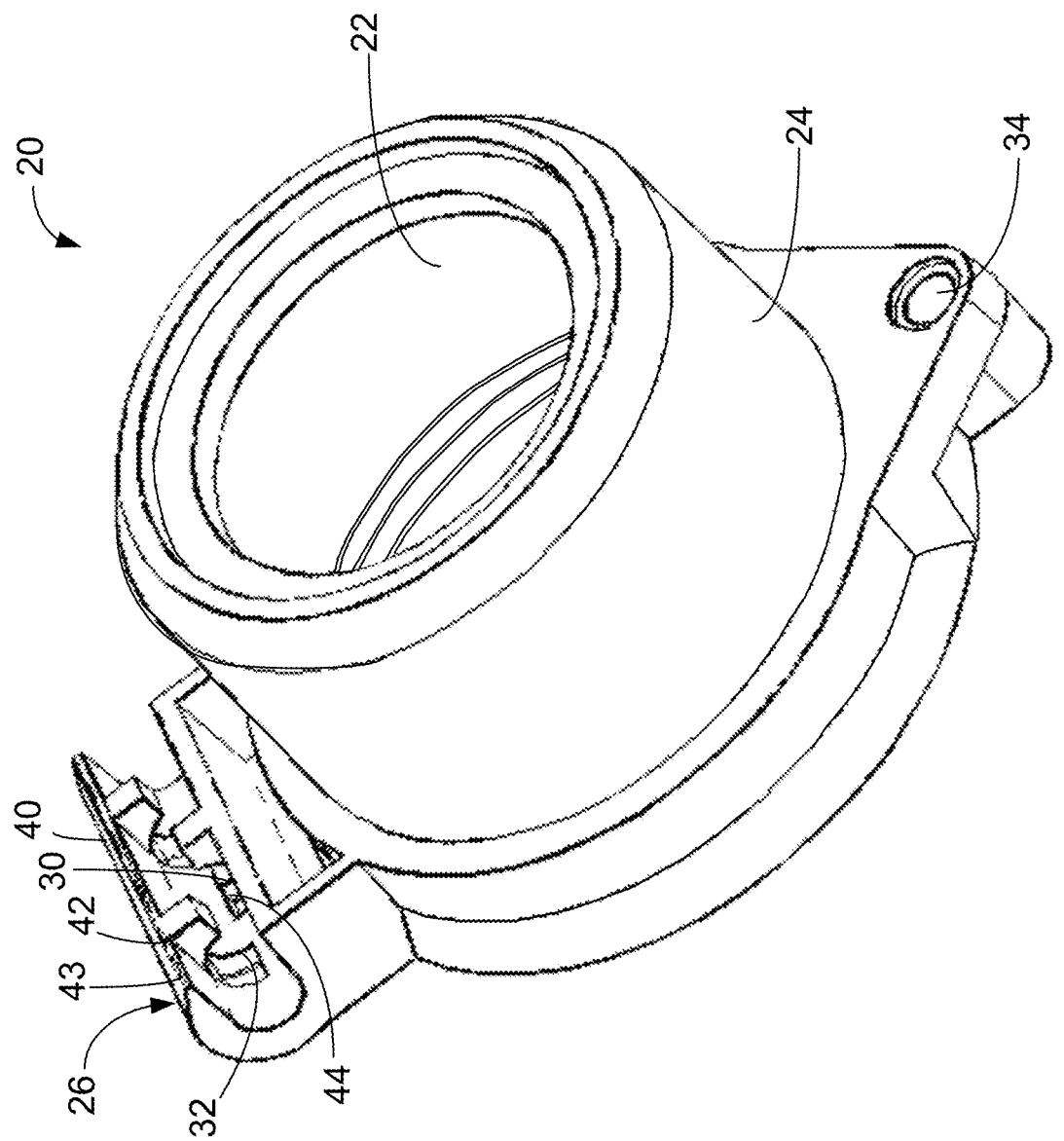
FIG. 5 is a perspective view of the cover receiving frame without the cover present.
Figure 6:
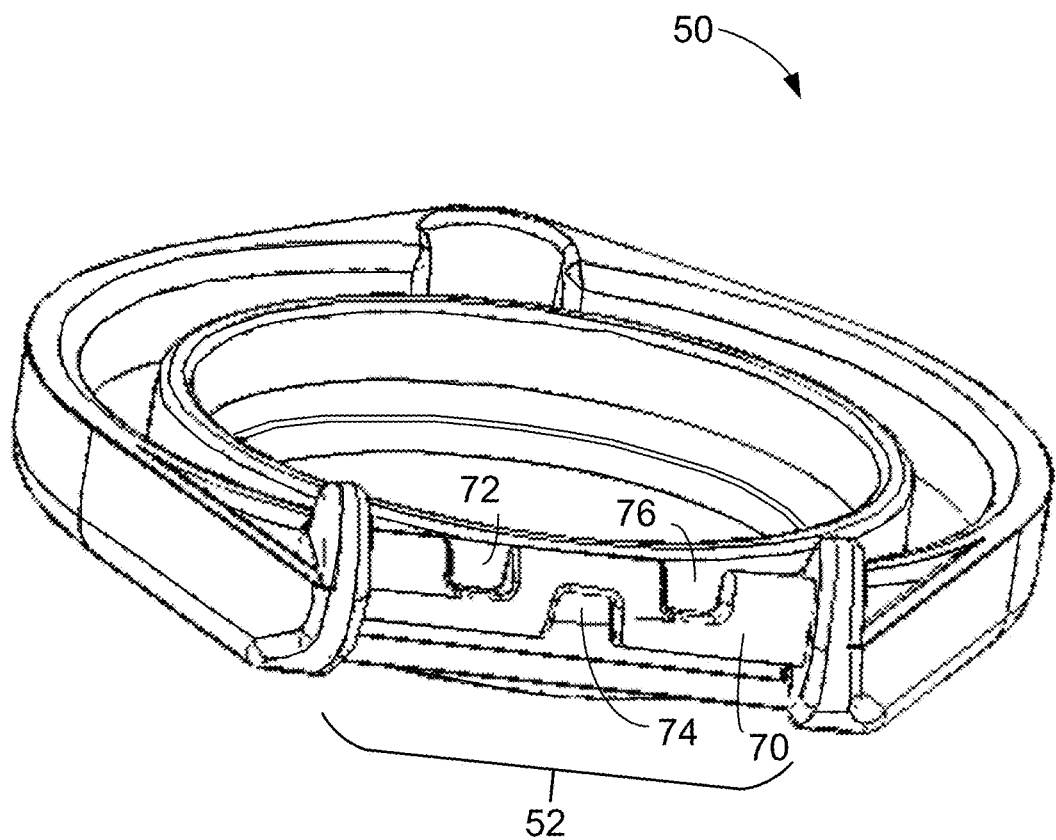
FIG. 6 is a further view of the cover.

FIG. 5 is a perspective view of the cover receiving frame 20 without the cover present. As shown in FIG. 5, the first hinge portion 26 is generally c-shaped with a plurality of alternating supports 42, 44, 46 present. Supports 42, 46 are aligned, with support 44 positioned between supports 42, 46. There is an opening 32 across from support 42, an opening 30 across from support 44, and an opening 28 across from support 46. A leading edge 43 of the first hinge portion is shown. Thus, the first hinge portion 26 is configured for connection with a second hinge portion in order to form a hinge assembly FIG. 6 shows the cover 50 and especially the second hinge portion 26 in more detail. The second hinge portion 52 includes an elongated member 70 with alternating notches or cutouts 72, 74, 76. Cutouts 72, 76 are on one side of the elongated member 70 and cutout 74 is positioned on an opposite of the elongated member and between cutouts 72, 76. Thus, the elongated member 70 provides a serpentine path.

Figure 7:
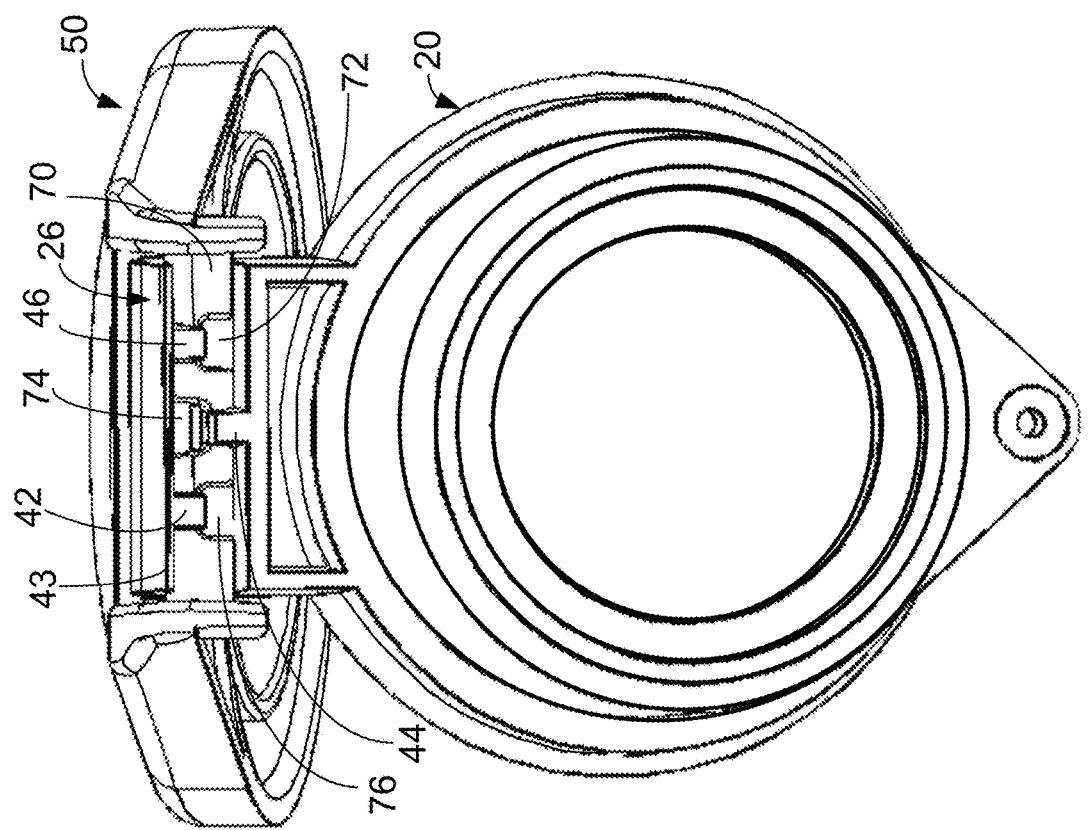
FIG. 7 is another perspective view of the assembly including both the cover receiving frame and the cover.

FIG. 7 is another view of the assembly including both the cover receiving frame and the cover 50. The first hinge portion 26 is shown with the leading edge 43 of the hinge portion 26 and with the alternating supports 42, 44, 46. The second hinge portion 52 is shown with the elongated member 70 with cutouts 72, 74, 76 shown. Note that each of the alternating supports 42, 44, 46 is fitted into a corresponding one of the cutouts 76, 74, 72. In assembling the device, the cover 50 is positioned generally parallel to the cover receiving frame 20 and the cover 60 is then rotated a few degrees until it is parallel to the cover receiving frame 20 and held captive thereby forming a hinge using the first hinge portion 26 and the second hinge portion 52. Thus, a hinge or hinge assembly is created which is pin-less.

The cover shown may be formed in various ways. For example, the cover may be formed of plastic through an injection molding process. It should be noted that due to the structure of the cover, it may be molded without slides thereby reducing tooling costs in comparison to designs which require slides.

Figure 8:
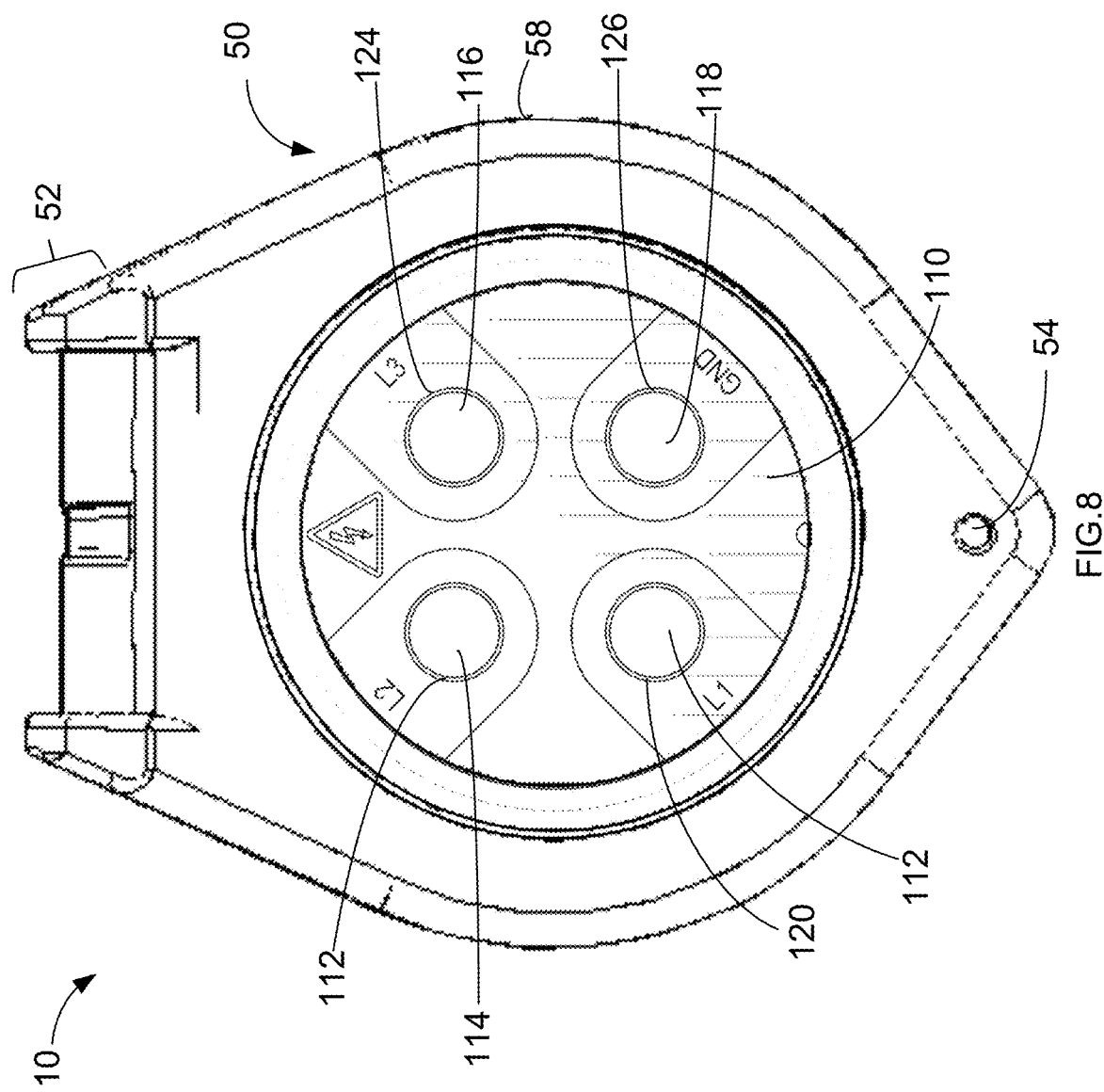
FIG. 8 illustrates an electrical safety monitor including the cover receiving frame and cover.

FIG. 8 illustrates an example of a device 10 such as an electrical safety device such as a PESD which includes an assembly formed from the cover receiving frame and cover. The device 10 has a face 110. The device 10 has a housing 12. A face 110 is shown. The device 10 provides for voltage indication and for providing test points. On the face 110 there are test points 112, 114, 116, 118. Each of the test points 112, 114, 116, 118 is associated with a different input line or phase and may be in the form of a conductive well for receiving a test probe. Thus, an operator could access a L1 voltage through test point 112, a L2 voltage through test point 114, a L3 voltage through test point 116, and GND through test point 118. Each of the test points may be hardwired directly to energy sources and allows for measurement of AC/DC voltages by inserting insulated meter probes into any two test points to take a voltage reading of either phase to phase or phase to ground. The test points may be protected by impedance to limit the maximum current possible in the event of a short circuit.

Also as shown in FIG. 8, there are illumination areas 120, 122, 124, 126 associated with each of the test points 112, 114, 116, 118. The illumination areas 120, 122, 124, 126 may be in the form of rings which extend around the corresponding test points. Each of the illumination areas 120, 122, 124, 126 may be illuminated to show the presence of voltage by illuminating the area. The illumination areas 120, 122, 124, 126 may receive light from visual indicators such as LEDs or other light sources disposed within the housing. The light may be piped to the corresponding illumination areas 120, 122, 124, 126. Thus, an individual may readily identify which of the line inputs have voltage present prior to making any measurements. In some embodiments, each of the visual indicators may flash at a rate associated with the voltage present such that a higher flash rate may generally indicate a higher voltage. Thus, an individual may be alerted as to the presence of voltage as well as an indication of magnitude of the voltage present.

Where the cover 50 is at least partially formed from a transparent plastic, an individual would not need to open the cover 50 in order to see the visual indicators. Thus, this advantageous in that a cover is provided but need not be opened in order to see the visual indicators, thereby potentially enhancing both safety and convenience. However, to access the test points, an individual may open the cover such as by removing a screw and then hinging opening the assembly to a position where the test points are accessible to the user. The manner in which the device is used may be subject to particular safety procedures established based on the particular application or environment in which the device is used.

Figure 9:
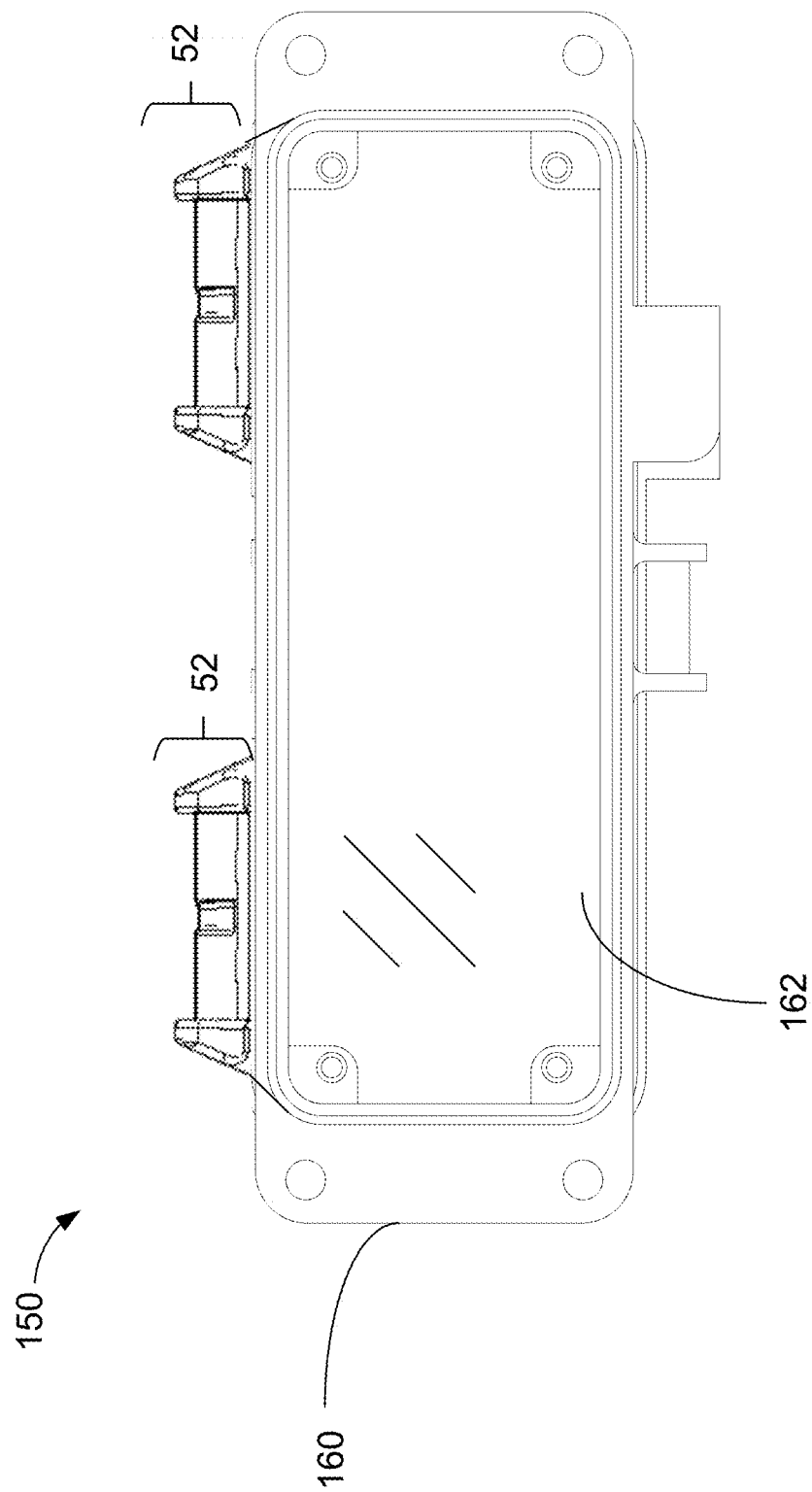
FIG. 9 illustrates a device such as a convenience interface device which includes a cover receiving frame.

It should also be understood that the pin-less captive hinge assembly may be used in other applications and environments. FIG. 9 illustrates a device 150 which includes a cover receiving frame 160 and a cover 162. The device 150 may be a convenience interface such as described in U.S. Pat. No. 10,522,937 to Allen et al., hereby incorporated by reference in its entirety, and may have any number of different ports, receptacles such as electrical outlets, or interfaces or connectors present. The device may be mounted through a cabinet or enclosure such as shown in FIG. 1. Multiple hinge assemblies may be used. For example, as shown in FIG. 9, there are two second hinge portions 52 shown. More or fewer hinge assemblies may be present. In addition, in some applications, the cover 162 need not be transparent.

Figure 10:
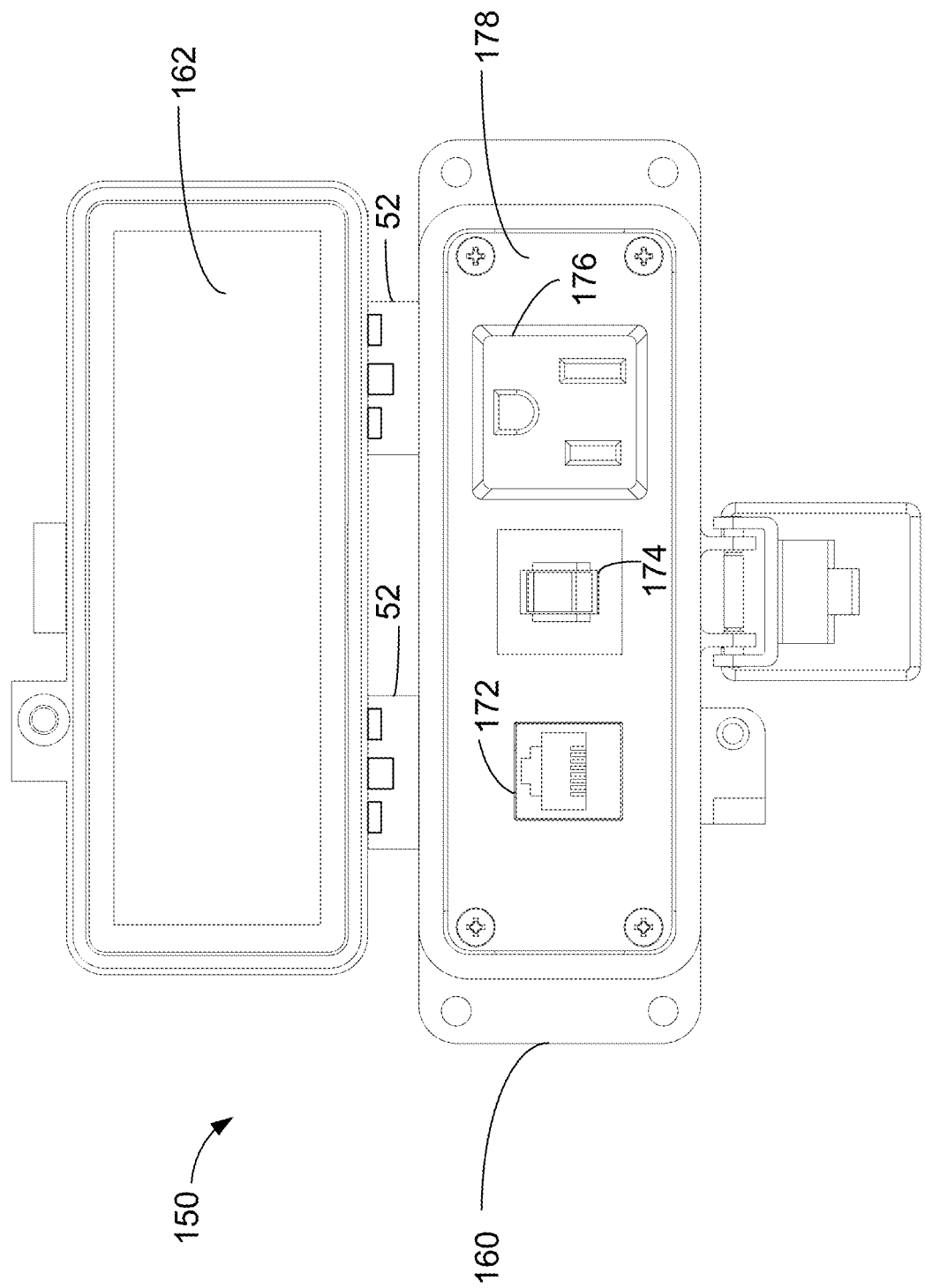
FIG. 10 further illustrates a convenience interface device which includes a cover receiving frame and cover in an open position.

FIG. 10 further illustrates the device 150 which includes a cover receiving frame 160 and cover 162 in an open position. The device 150 may include a convenience interface 178 which includes a face with any number of ports, connectors, interfaces, or outlet receptacles such as a network interface or port 172, circuit breaker 174, and an electrical outlet or receptacle 176. Multiple hinge assemblies 52 are shown. Thus, it is to be understood that the pin-less captive hinge assembly shown and described herein may be used for any number of different applications or devices. It is to be further understood that the receiving frame may be of different geometries and shapes.

Therefore, a pin-less captive hinge assembly has been shown and described. The pin-less captive hinge assembly may be incorporated into designs for electrical safety devices such as compact combination electrical panel safety monitors and test points. The invention is not to be limited to the particular embodiments described herein. In particular, the invention contemplates numerous variations in the particular size and shape of the cover receiving frame and cover, the configuration of the electrical panel safety monitor such as the number of line inputs, the presence or absence of test points, the number or configuration of visual indicators, the size and shape of the housing, and other variations. The foregoing description has been presented for purposes of illustration and description. It is not intended to be an exhaustive list or limit any of the invention to the precise forms disclosed. It is contemplated that other alternatives or exemplary aspects are considered included in the invention. The description is merely examples of embodiments, processes, or methods of the invention. It is understood that any other modifications, substitutions, and/or additions can be made, which are within the intended spirit and scope of the invention.

What is claimed is:

1. A pin-less captive hinge assembly comprising:
a cover receiving frame having a first hinge portion thereon, the first hinge portion having a generally c-shape and a plurality of alternating supports positioned along a bottom portion of the first hinge portion;
a cover having a second hinge portion thereon for interconnection with the first hinge portion;
the second hinge portion having an elongated member for fitting generally within the c-shape and a plurality of alternating cutouts positioned along the elongated member;
wherein the pin-less captive hinge assembly is assembled by positioning the cover generally parallel to the cover receiving frame and rotating the cover until it is captive.

2. The assembly of claim 1 wherein the cover receiving frame is formed of plastic.

3. The assembly of claim 1 wherein the cover is formed of plastic.

4. The assembly of claim 1 wherein the cover is formed of transparent plastic.

5. The assembly of claim 1 further comprising a voltage indicator having a housing with a face with one or more visual indicators and positioned such that the face is exposed when the cover is in a hinged open position.

6. The assembly of claim 5 wherein the voltage indicator further comprises a plurality of test points, each of the plurality of test points accessible at the face of the housing when the cover is in the hinged open position.

7. The assembly of claim 6 further comprising illumination areas associated with each of the test points, wherein each of the illumination areas is provided light by one or more of the plurality of light indicators.

8. The assembly of claim 7 wherein each of the illumination areas is positioned around a corresponding one of the test points.

9. The assembly of claim 6 wherein each of the test points comprises a conductive well for insertion of a test probe.

10. The assembly of claim 1 further comprising a convenience interface framed within the cover receiving frame wherein the panel interface comprises at least one of a port and an electrical outlet.

11. A pin-less captive hinge assembly comprising:
a cover receiving frame having a first hinge portion thereon, the first hinge portion having a generally c-shape and a plurality of alternating supports positioned along a bottom portion of the first hinge portion;
a cover formed from transparent plastic having a second hinge portion thereon for interconnection with the first hinge portion;
the second hinge portion having an elongated member for fitting generally within the c-shape and a plurality of alternating cutouts positioned along the elongated member;
wherein the pin-less captive hinge assembly assembled by positioning the cover parallel to the cover receiving frame and rotating the cover until it is captive;
wherein the first hinge portion and the second hinge portion forming a pin-less hinge.

12. The assembly of claim 11 wherein the cover receiving frame is formed of plastic.

13. The assembly of claim 11 further comprise a voltage indicator having a housing with a face with one or more visual indicators and positioned such that the face is exposed when the cover is in a hinged open position.

14. The assembly of claim 13 wherein the voltage indicator further comprises a plurality of test points, each of the plurality of test points accessible at the face of the housing when the cover is in the hinged open position.

15. The assembly of claim 14 further comprising illumination areas associated with each of the test points, wherein each of the illumination areas is provided light by one or more of the plurality of light indicators.

16. The assembly of claim 15 wherein each of the illumination areas is positioned around a corresponding one of the test points.

17. The assembly of claim 16 wherein each of the test points comprises a conductive well for insertion of a test probe.

18. The assembly of claim 11 further comprising a convenience interface framed within the cover receiving frame wherein the panel interface comprises at least one of a port and an electrical outlet.

19. An electrical safety device comprising:
a housing with a face with one or more visual indicators positioned on the face;
a cover receiving frame for placement on an end of the housing, the cover receiving frame having a first hinge portion thereon, the first hinge portion having a generally c-shape and a plurality of alternating supports positioned along a bottom portion of the first hinge portion;
a cover formed from transparent plastic having a second hinge portion thereon for interconnection with the first hinge portion;
the second hinge portion having an elongated member for fitting generally within the c-shape and a plurality of alternating cutouts positioned along the elongated member;
wherein the cover receiving frame is assembled with the cover by positioning the cover generally parallel to the cover receiving frame and rotating the cover until it is captive;
wherein the first hinge portion and the second hinge portion form a pin-less hinge.

20. The electrical safety device of claim 19 further comprising a plurality of test points, each of the plurality of test points accessible at the face of the housing when the cover is in a hinged open position.

* * * * *